United States Patent
Hatch et al.

(10) Patent No.: US 12,150,248 B2
(45) Date of Patent: Nov. 19, 2024

(54) SYSTEM FOR PROVIDING DYNAMIC FEEDBACK FOR SELECTIVE ADHESION PCB PRODUCTION

(71) Applicant: Honeywell Federal Manufacturing & Technologies, LLC, Kansas City, MO (US)

(72) Inventors: Jonathan Douglas Hatch, Cleveland, MO (US); Stephen McGarry Hatch, Blue Springs, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 222 days.

(21) Appl. No.: 17/901,417

(22) Filed: Sep. 1, 2022

(65) Prior Publication Data
US 2023/0072115 A1   Mar. 9, 2023

Related U.S. Application Data

(62) Division of application No. 16/816,607, filed on Mar. 12, 2020, now Pat. No. 11,439,023.

(51) Int. Cl.
*H05K 1/02* (2006.01)
*H05K 1/03* (2006.01)
(Continued)

(52) U.S. Cl.
CPC ......... *H05K 3/1283* (2013.01); *H05K 3/0005* (2013.01); *H05K 3/108* (2013.01);
(Continued)

(58) Field of Classification Search
CPC ........ H05K 1/02; H05K 1/0227; H05K 1/028; H05K 1/03; H05K 1/0306; H05K 1/0393; H05K 1/115; H05K 1/144; H05K 3/00; H05K 3/05; H05K 3/064; H05K 3/07; H05K 3/10; H05K 3/38; H05K 3/48;
(Continued)

(56) References Cited

U.S. PATENT DOCUMENTS 9,504,148 B1 *  11/2016  Hatch ................... H05K 3/103
9,668,360 B2    5/2017   Davis et al.
(Continued)

*Primary Examiner* — Xiaoliang Chen
(74) *Attorney, Agent, or Firm* — Hovey Williams LLP

(57) ABSTRACT

A system for providing selective adhesion printed circuit board (PCB) production comprises a conveyor mechanism, a curing system, and a computer. The conveyor mechanism is configured to convey a series of selective adhesion blanks, wherein each selective adhesion blank is utilized to produce a PCB and includes a flexible film, a substrate, a conductive layer, and a curable adhesive. The conductive layer is formed from electrically conductive material and adhered to the substrate. The curable adhesive is positioned between the flexible film and the conductive layer and is configured to selectively bond with the conductive layer when the curable adhesive is cured. The curing system is configured to cure the curable adhesive. The computer includes a processing element configured or programmed to: receive a plurality of PCB designs, and direct the curing system to cure the curable adhesive of a plurality of selective adhesion blanks for each PCB design.

8 Claims, 6 Drawing Sheets

(51) Int. Cl.
    *H05K 3/00* (2006.01)
    *H05K 3/07* (2006.01)
    *H05K 3/10* (2006.01)
    *H05K 3/12* (2006.01)
    *H05K 3/38* (2006.01)
    *H05K 3/46* (2006.01)
(52) U.S. Cl.
    CPC ........... *H05K 3/386* (2013.01); *H05K 3/4691* (2013.01); *H05K 3/00* (2013.01)
(58) Field of Classification Search
    CPC ........ H05K 3/103; H05K 3/108; H05K 3/125; H05K 3/303; H05K 3/386; H05K 3/388; H05K 3/389; H05K 3/427; H05K 3/1283; H05K 3/4652; H05K 3/4691; H05K 9/0022; H05K 9/0088; H05K 2201/0145; H05K 2201/0154; H05K 2201/0195; H05K 2201/0358; H05K 2201/05
    USPC ................... 29/650, 609, 830, 846; 174/254
    See application file for complete search history.

(56) References Cited

U.S. PATENT DOCUMENTS

| | | | | |
|---|---|---|---|---|
| 9,795,035 | B2* | 10/2017 | Hatch | H05K 1/144 |
| 9,955,571 | B2* | 4/2018 | Hatch | H05K 3/386 |
| 10,820,457 | B1* | 10/2020 | Kishi | H05K 1/0227 |
| 2004/0231141 | A1* | 11/2004 | Nishinaka | H05K 3/108 |
| | | | | 29/830 |
| 2012/0222889 | A1* | 9/2012 | Davis | C09J 175/04 |
| | | | | 523/400 |
| 2017/0164463 | A1* | 6/2017 | Hatch | H05K 1/0306 |
| 2017/0374741 | A1* | 12/2017 | Hatch | H05K 1/0393 |
| 2020/0236827 | A1* | 7/2020 | Hatch | H05K 13/0417 |

* cited by examiner

SYSTEM FOR PROVIDING DYNAMIC FEEDBACK FOR SELECTIVE ADHESION PCB PRODUCTION

RELATED APPLICATION

The current patent application is a divisional patent application which claims priority benefit, with regard to all common subject matter, of earlier-filed U.S. patent application Ser. No. 16/816,607, titled "SYSTEM FOR PROVIDING DYNAMIC FEEDBACK FOR SELECTIVE ADHESION PCB PRODUCTION", filed Mar. 12, 2020. The earlier-filed patent application is hereby incorporated by reference, in its entirety, into the current patent application.

STATEMENT REGARDING FEDERALLY-SPONSORED RESEARCH OR DEVELOPMENT

This invention was made with Government support under Contract No.: DE-NA0000622 awarded by the United States Department of Energy/National Nuclear Security Administration. The Government has certain rights in the invention.

FIELD OF THE INVENTION

Embodiments of the current invention relate to systems for providing dynamic feedback for selective adhesion printed circuit board (PCB) production.

DESCRIPTION OF THE RELATED ART

Printed circuit boards (PCBs) are typically produced in a multi-step process that involves mask exposure and board etching and requires that a design of the PCB, i.e., a pattern of traces and pads that form the printed circuit, be fixed from the start of the process to the end of the process. Making any corrections or changes to the design of the PCB requires major changes to the production process. The changes may result in a long lead time and increased costs for production to continue.

SUMMARY OF THE INVENTION

Embodiments of the current invention solve the above-mentioned problems and provide systems that allow for multiple PCB designs to be produced without any delay between the production of different designs. One embodiment of the system broadly comprises a conveyor mechanism, a curing system, and a computer. The conveyor mechanism is configured to convey a series of selective adhesion blanks, wherein each selective adhesion blank is utilized to produce a PCB and includes a flexible film, a substrate, a conductive layer, and a curable adhesive. The flexible film forms a top layer of the selective adhesion blank. The substrate forms a bottom layer of the selective adhesion blank. The conductive layer is formed from electrically conductive material and is adhered to the substrate. The curable adhesive is positioned between the flexible film and the conductive layer and is configured to selectively bond with the conductive layer when the curable adhesive is cured. The curing system is configured to cure the curable adhesive for each selective adhesion blank. The computer includes a processing element in electronic communication with a memory element. The processing element is configured or programmed to: receive a plurality of PCB designs, and direct the curing system to cure the curable adhesive of a plurality of selective adhesion blanks for each PCB design.

Another embodiment of the system allows for changes to the design of the PCB to be made based on optical inspection of selective adhesion blanks that are prepopulated with parts. The system broadly comprises a conveyor mechanism, an optical inspection unit, a curing system, and a computer. The conveyor mechanism is configured to convey a series of selective adhesion blanks, wherein each selective adhesion blank is prepopulated with parts and utilized to produce a PCB. Each selective adhesion blank includes a flexible film, a substrate, a conductive layer, and a curable adhesive. The flexible film forms a top layer of the selective adhesion blank. The substrate forms a bottom layer of the selective adhesion blank. The conductive layer is formed from electrically conductive material and is adhered to the substrate. The curable adhesive is positioned between the flexible film and the conductive layer and is configured to selectively bond with the conductive layer when the curable adhesive is cured. The optical inspection unit is configured to generate current image data of each selective adhesion blank. The curing system is configured to cure the curable adhesive for each selective adhesion blank. The computer includes a processing element in electronic communication with a memory element. The processing element is configured or programmed to: receive a PCB design including placement of the parts and a pattern of traces and pads, receive the current image data, compare the current image data with standard image data corresponding to the PCB design, determine a modification to the PCB design if a difference between the current image data and the standard image data is detected, and direct the curing system to cure the curable adhesive of each selective adhesion blank for which the difference is detected according to the modification of the PCB design.

Yet another embodiment of the system broadly comprises a conveyor mechanism, an optical inspection unit, a curing system, a peel roller, and a computer. The conveyor mechanism is configured to convey a series of selective adhesion blanks, wherein each selective adhesion blank is prepopulated with parts and utilized to produce a PCB. Each selective adhesion blank includes a flexible film, a substrate, a conductive layer, and a curable adhesive. The flexible film forms a top layer of the selective adhesion blank. The substrate forms a bottom layer of the selective adhesion blank. The conductive layer is formed from electrically conductive material and is adhered to the substrate. The curable adhesive is positioned between the flexible film and the conductive layer and is configured to selectively bond with the conductive layer when the curable adhesive is cured. The optical inspection unit is configured to generate current image data of each selective adhesion blank. The curing system is configured to cure the curable adhesive for each selective adhesion blank. The peel roller is configured to remove the flexible film, the curable adhesive, and the bonded conductive layer. The computer includes a processing element in electronic communication with a memory element. The processing element is configured or programmed to: receive a PCB design including placement of the parts and a pattern of traces and pads, receive the current image data, compare the current image data with standard image data corresponding to the PCB design, determine a modification to the PCB design if a difference between the current image data and the standard image data is detected, direct the curing system to cure the curable adhesive of each selective adhesion blank for which the difference is detected according to the modification of the PCB design, and direct the curing system to cure the curable adhesive of each selective adhesion blank according to the PCB design if a difference between the current image data and the standard image data is not detected.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 1:
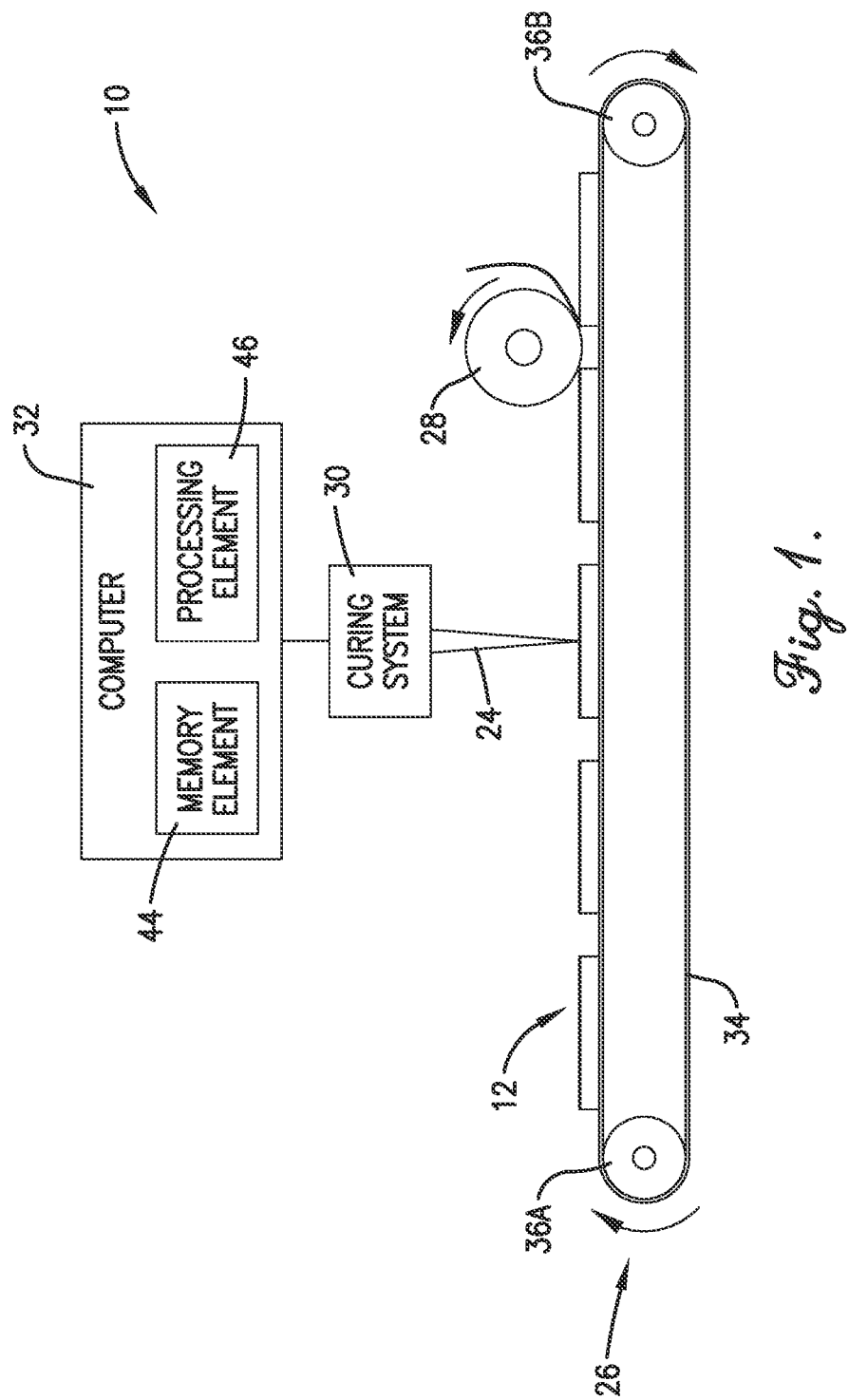
FIG. 1 is a schematic block diagram of a system, constructed in accordance with various embodiments of the current invention, for providing selective adhesion printed circuit board (PCB) production, the system including a conveyor mechanism, a curing system, a peel roller, and a computer.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

Figure 4:
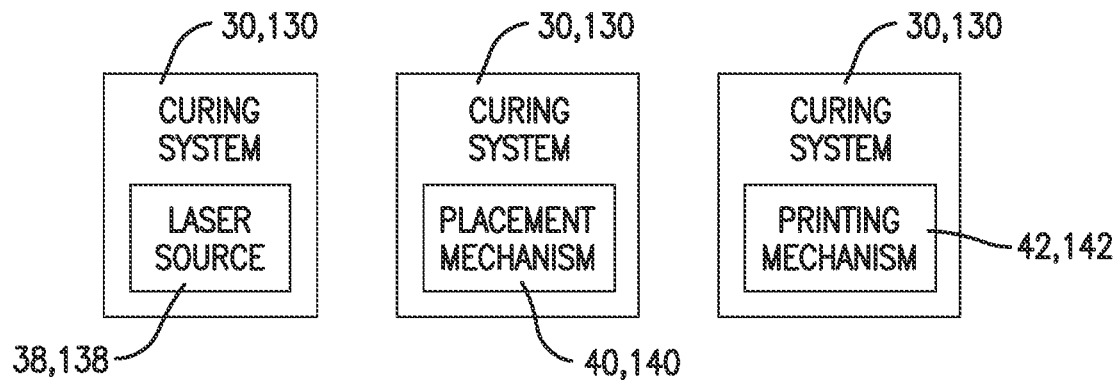
FIG. 4 is a schematic block diagram of three embodiments of the curing system.
Figure 5:
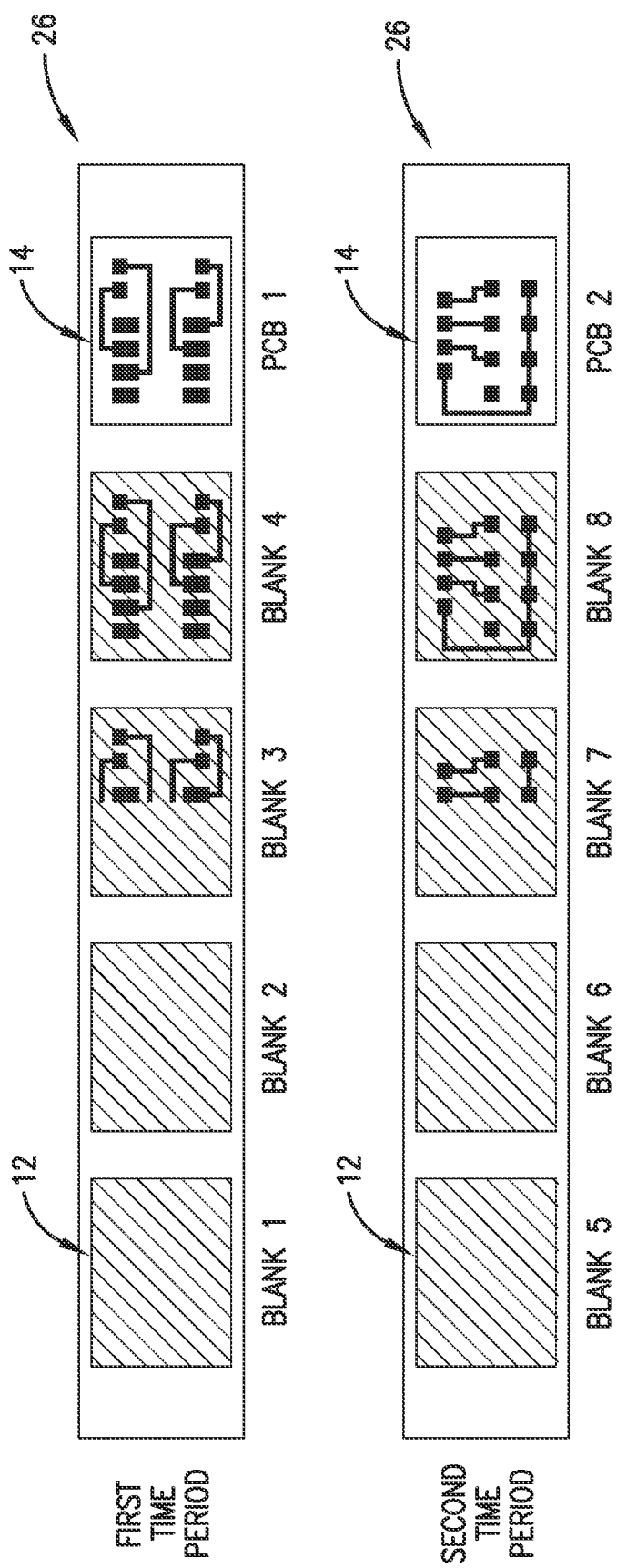
FIG. 5 is a top view of the conveyor mechanism conveying a plurality of selective adhesion blanks during first and second time periods of the production process.

Referring to FIGS. 1, 4, and 5, a system 10 for providing selective adhesion printed circuit board (PCB) production is shown. The system 10 is configured to be best implemented with a selective adhesion blank 12, which is utilized in a process to produce a PCB 14, as described in U.S. Pat. No. 9,504,148, "RAPID PCB PROTOTYPING BY SELECTIVE ADHESION", issued Nov. 22, 2016, and U.S. patent application Ser. No. 16/253,296, "SYSTEM AND METHOD FOR LARGE-SCALE PCB PRODUCTION INCLUDING CONTINUOUS SELECTIVE ADHESION", filed Jan. 22, 2019, each of which is hereby incorporated by reference, in its entirety, into the current patent application.

The selective adhesion blank 12 and its use in fabricating a PCB 14 is summarized as follows. The selective adhesion blank 12 includes one layer each of the following materials oriented in a stack from top to bottom in the listed order: a flexible film 16, a curable adhesive 18, a conductive layer 20, and a substrate 22. The flexible film 16 may be formed from flexible plastic, polyester, or any other suitable flexible material and is generally transmissive, transparent, or translucent to a broad range of wavelengths of radiation including near-UV light, UV light, blue wavelength light, and others. In addition, the flexible film 16 may be easily sheared, torn, or cut. The curable adhesive 18 generally cures, hardens, or bonds when exposed to near-UV light, UV light, blue wavelength light, or other stimulation such as infrared radiation or heat, but otherwise remains pliable and separable. The conductive layer 20 is formed from electrically conductive materials, such as metals or metal alloys, and may be provided as a layer of foil or may be applied by spraying, vapor deposition, or other methods. In addition, the conductive layer 20 may be easily sheared, torn, or cut. The substrate 22 may be formed from fiberglass, polymers, resins, or the like, or combinations thereof, and may be rigid or flexible. The flexible film 16 is firmly bonded to the curable adhesive 18. The curable adhesive 18 is lightly adhered to the conductive layer 20, but more firmly bonds to the conductive layer 20 when the curable adhesive 18 is cured. The conductive layer 20 is adhered to the substrate 22, but once the curable adhesive 18 is cured, the bond between the curable adhesive 18 and the conductive layer 20 is greater than the bond between the conductive layer 20 and the substrate 22.

Figure 2:
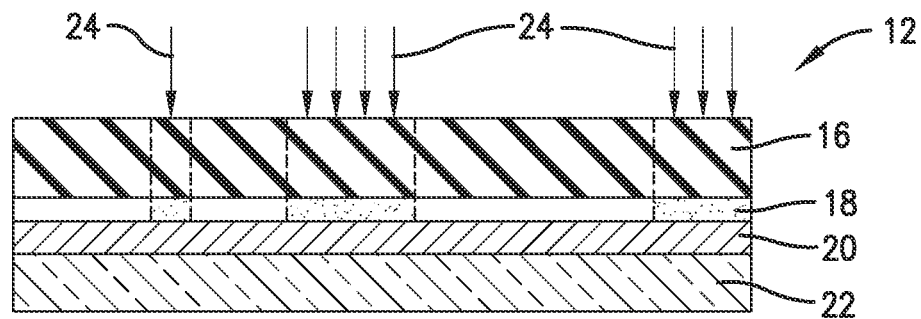
FIG. 2 is a side cross-sectional view of a prior art selective adhesion blank including a flexible film, a curable adhesive, a conductive layer, and a substrate, oriented from top to bottom in a stack.
Figure 3:
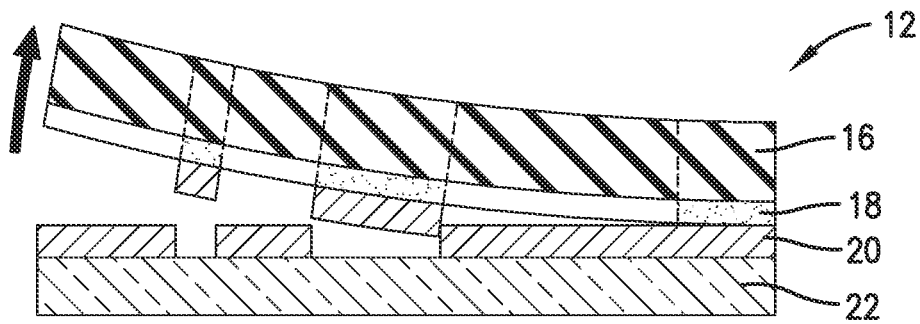
FIG. 3 is a side cross-sectional view of the selective adhesion blank illustrating the flexible film, the curable adhesive, and a selective portion of the conductive layer being lifted.

The PCB 14 may be formed from the selective adhesion blank 12 as follows. Referring to FIGS. 2 and 3, the selective adhesion blank 12 is positioned to have the flexible film 16 and the curable adhesive 18 exposed to a radiation source generating radiation 24. In some embodiments, the radiation source may be a laser which can be programmed, controlled, and directed to expose selected areas or portions of the curable adhesive 18 in order to create a proper pattern of traces and pads to form the desired printed circuit. As shown in FIG. 2, the radiation 24 has been directed to strike three separate areas of the flexible film 16 and the curable adhesive 18. In other embodiments, the radiation source may include one or more radiation generators which generate radiation 24 to cover the entire surfaces of the flexible film 16 and curable adhesive 18 during an exposure. In order to create the pattern of traces and pads, one or more masks may be used, such that the masks shield the curable adhesive from the radiation 24 in those areas where traces and pads are desired. The masks may be separate films or plates that are placed on the surface of the flexible film 16. Or, the masks may be printed onto the surface of the flexible film 16.

In those areas exposed to the radiation 24, the curable adhesive 18 cures and firmly bonds to the conductive layer 20. The flexible film 16 is then removed from the selective adhesion blank 12 by applying a pulling force, as shown in FIG. 3. In those areas where the conductive layer 20 is bonded to the curable adhesive 18, those areas of the conductive layer 20 tear and separate from the areas not bonded to the curable adhesive 18. The remaining conductive layer 20 forms the pattern of traces and pads which is the printed circuit. Once the flexible film 16 and the conductive layer 20 bonded thereto are removed, then the remaining conductive layer 20 and the substrate 22 form the PCB 14.

The system 10 of the current invention broadly comprises a conveyor mechanism 26, a peel roller 28, a curing system 30, and a computer 32. The conveyor mechanism 26 includes a belt 34 and first and second rollers 36A, 36B. The belt 34 is formed from a closed loop of flexible material, such as rubbers, polymers, or the like, or combinations thereof. The first and second rollers 36A, 36B are spaced apart from one another. The belt 34 is wrapped around each roller 36A, 36B, so that when the rollers 36A, 36B rotate, the conveyor mechanism 26 moves or conveys selective adhesion blanks 12 and PCBs 10.

The peel roller 28 includes a circumferential side wall. In some embodiments, the side wall may include a tacky or sticky outer surface. In other embodiments, the side wall may include a plurality of ports or openings distributed along its circumference through which vacuum or suction may be applied. In yet other embodiments, the side wall may include one or more mating or interlocking features on the outer surface that engage with complementary features on the selective adhesion blank 12. The peel roller 28 contacts the upper surface of the flexible film 16 of the selective adhesion blank 12 in order to remove the flexible film 16, the curable adhesive 18, and the bonded conductive layer 20.

The curing system 30 generally provides the radiation 24 to cure the curable adhesive 18 of the selective adhesion blank 12. In some embodiments, the curing system 30 includes a laser source 38 configured to generate the radiation 24 in the form of a laser beam having a wavelength in the near-UV light, UV light, or blue wavelength light ranges to cure the curable adhesive 18. The laser beam may be controlled and directed to strike the surfaces of the flexible film 16 and the curable adhesive 18, perhaps in a scanning fashion, in a pattern that forms the traces and pads of the printed circuit. In other embodiments, the curing system 30 may include one or more radiation generators which generate radiation 24 to cover the entire surfaces of the flexible film 16 and curable adhesive 18 during an exposure. At least one mask that includes a negative of the pattern of traces and pads of the printed circuit is used during the exposure. The curing system 30 may include a placement mechanism 40 that is configured to place the mask on the upper surface of the flexible film 16. In still other embodiments, the curing system 30 may include the one or more radiation generators to generate radiation 24 as well as a printing mechanism 42 to print the negative pattern mask onto the upper surface of the flexible film 16. In various embodiments, the curing system 30 may include controlling and/or processing electronic circuitry and memory or data storage which controls the operation of the components utilized in each embodiment mentioned above.

The computer 32 generally provides control of the conveyor mechanism 26 and the curing system 30 and includes a memory element 44 and a processing element 46. The computer 32 may be embodied by workstation computers, desktop computers, laptop computers, palmtop computers, notebook computers, tablets or tablet computers, or the like. The computer 32 may also include a display, a user interface, one or more communication elements, and the like which are not discussed in detail.

The memory element 44 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 44 may be embedded in, or packaged in the same package as, the processing element 46. The memory element 44 may include, or may constitute, a non-transitory "computer-readable medium". The memory element 44 may store the instructions, code, code statements, code segments, software, firmware, programs, applications, apps, services, daemons, or the like that are executed by the processing element 46. The memory element 44 may also store data that is received by the processing element 46 or the device in which the processing element 46 is implemented. The processing element 46 may further store data or intermediate results generated during processing, calculations, and/or computations as well as data or final results after processing, calculations, and/or computations. In addition, the memory element 44 may store settings, data, documents, sound files, photographs, movies, images, databases, and the like.

The processing element 46 may comprise one or more processors. The processing element 46 may include electronic hardware components such as microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 46 may generally execute, process, or run instructions, code, code segments, code statements, software, firmware, programs, applications, apps, processes, services, daemons, or the like. The processing element 46 may also include hardware components such as registers, finite-state machines, sequential and combinational logic, and other electronic circuits that can perform the functions necessary for the operation of the current invention. In certain embodiments, the processing element 46 may include multiple computational components and functional blocks that are packaged separately but function as a single unit. The processing element 46 may be in electronic communication with the other electronic components through serial or parallel links that include universal busses, address busses, data busses, control lines, and the like.

The computer 32 in general, and processing element 46 specifically, may be operable, configured, or programmed to perform the following functions by utilizing hardware, software, firmware, or combinations thereof. The computer 32 receives a plurality of designs, wherein each design includes the pattern to form the traces and pads for a printed circuit. Typically, there is one design per PCB 14. In some instances, more than one design may be implemented on a single PCB 14, wherein the PCB 14 may be cut into separate PCBs 10, one PCB 14 per design, later in the production process. Furthermore, each design may be utilized to produce a plurality of PCBs 10. For example, a first design may be utilized to produce 100 PCBs 10, each including a first printed circuit. A second design may be utilized to produce 500 PCBs 10, each including a second printed circuit—and so forth with additional designs to produce additional PCBs 10. Thus, the computer 32 may establish a sequence of designs to be implemented.

The computer 32 controls or directs the curing system 30 to apply the appropriate curing scheme for each design. For example, in some embodiments, the computer 32 may determine a set of instructions or a program to control the laser source 38 to direct the laser beam in the appropriate path to create the pattern of traces and pads for each design. Alternatively, the computer 32 may retrieve the instruction set or program from the memory element 44 according to the design. Otherwise, the curing system 30 may include a plurality of instruction sets or programs, one for each design, stored in its memory. The computer 32 may direct the curing system 30 on which instruction set or program to use for each design. The computer 32 may transmit one or more signals, a stream of data, or a combination thereof to the curing system 30 for each PCB 14 to be produced or for each design to be implemented on a plurality of PCBs 10.

In other embodiments, the computer 32 may determine the timing for when to energize the radiation source (that does not include a laser) of the curing system 30. In addition, the computer 32 may control or direct the placement mechanism 40 to position the mask over the flexible film 16 and the curable adhesive 18. The curing system 30 may include at least one mask for each design. The computer 32 may control or direct the placement mechanism 40 to position the appropriate mask for each design. Alternatively, the computer 32 may control or direct the printing mechanism 42 to print the appropriate mask on the flexible film 16 for each design.

In various embodiments, the computer 32 may also control or direct the operation of the conveyor mechanism 26 and the peel roller 28. For example, the computer 32 may control the direction of motion and the speed of the belt 34 of the conveyor mechanism 26. The computer 32 may set a constant speed for the belt 34 or may reduce the speed of the belt 34 while each selective adhesion blank 12 is being cured. Likewise, the computer 32 may control the speed and direction of rotation of the peel roller 28. The computer 32 may set a constant speed of rotation for the peel roller 28 or reduce the speed of rotation while each selective adhesion blank 12 is being cured, such that the speed of rotation of the peel roller 28 corresponds to the speed of motion of the conveyor mechanism 26. The computer 32 may transmit one or more signals, a stream of data, or a combination thereof to the conveyor mechanism 26 and the peel roller 28.

The system 10 may operate as follows. A series of selective adhesion blanks 12 are fed or supplied to the conveyor mechanism 26. The selective adhesion blanks 12 move forward on the conveyor mechanism 26 to the curing system 30. The computer 32 may direct or control the operation of the conveyor mechanism 26, such as setting the speed, and starting and stopping the belt 34. The curing system 30 cures the curable adhesive 18 according to the design for the PCB 14 to be produced. If using a laser source 38, the curing system 30 may scan the selective adhesion blank 12 from one end to the opposite end. After being cured, the selective adhesion blanks 12 move forward on the conveyor mechanism 26 to the peel roller 28. The side wall of the peel roller 28 contacts the upper surface of the flexible film 16 and attaches to the flexible film 16. As the conveyor mechanism 26 moves the selective adhesion blank 12 forward, the rotation of the peel roller 28 pulls the flexible film 16 upward, removing the flexible film 16, the curable adhesive 18, and the bonded conductive layer 20. After the selective adhesion blank 12 moves past the peel roller 28, the flexible film 16, the curable adhesive 18, and the bonded conductive layer 20 are completely removed, and the PCB 14 is ready to be further processed.

The system 10 is also configured to automatically produce a plurality of PCB designs, wherein each design is used to produce a plurality of PCBs 10. Referring to FIG. 5, during a first time period, a plurality of PCBs 10 having a first design are being produced, with first through fourth selective adhesion blanks 12 and a first PCB 14 on the conveyor mechanism 26. At this time, the computer 32 has already instructed, directed, or controlled the curing system 30 to be configured to cure the selective adhesion blanks 12 using the first design. The first and second selective adhesion blanks 12 are waiting to be cured. The third selective adhesion blank 12 is being cured. The fourth selective adhesion blank 12 has been cured and is waiting to have its flexible film 16, curable adhesive 18, and bonded conductive layer 20 removed. The first PCB 14 has had its flexible film 16, curable adhesive 18, and bonded conductive layer 20 removed by the peel roller 28.

After the remaining selective adhesion blanks 12 have been processed, the computer 32 instructs, directs, or controls the curing system 30 to be configured to cure the selective adhesion blanks 12 using the second design. If the curing system 30 utilizes a laser source 38 to cure the selective adhesion blanks 12, then the laser source 38 is configured to guide the laser beam to follow the path to implement the second design. If the curing system 30 utilizes masks placed on the flexible film 16 to cure the selective adhesion blanks 12, then the computer 32 controls or directs the placement mechanism 40 to position the appropriate mask over the flexible film 16. If the curing system 30 prints masks onto the flexible film 16 to cure the selective adhesion blanks 12, then the computer 32 controls or directs the printing mechanism 42 to print the appropriate mask on the flexible film 16.

During a second time period, fifth through eighth selective adhesion blanks 12 and a second PCB 14 are on the conveyor mechanism 26. The fifth and sixth selective adhesion blanks 12 are waiting to be cured. The seventh selective adhesion blank 12 is being cured. The eighth selective adhesion blank 12 has been cured and is waiting to have its flexible film 16, curable adhesive 18, and bonded conductive layer 20 removed. The second PCB 14 has had its flexible film 16, curable adhesive 18, and bonded conductive layer 20 removed by the peel roller 28. After the remaining selective adhesion blanks 12 have been processed, the computer 32 may instruct, direct, or control the curing system 30 to be configured to cure the selective adhesion blanks 12 using additional designs, wherein each design may be utilized to cure and produce a variable number of PCBs 10.

Figure 6:
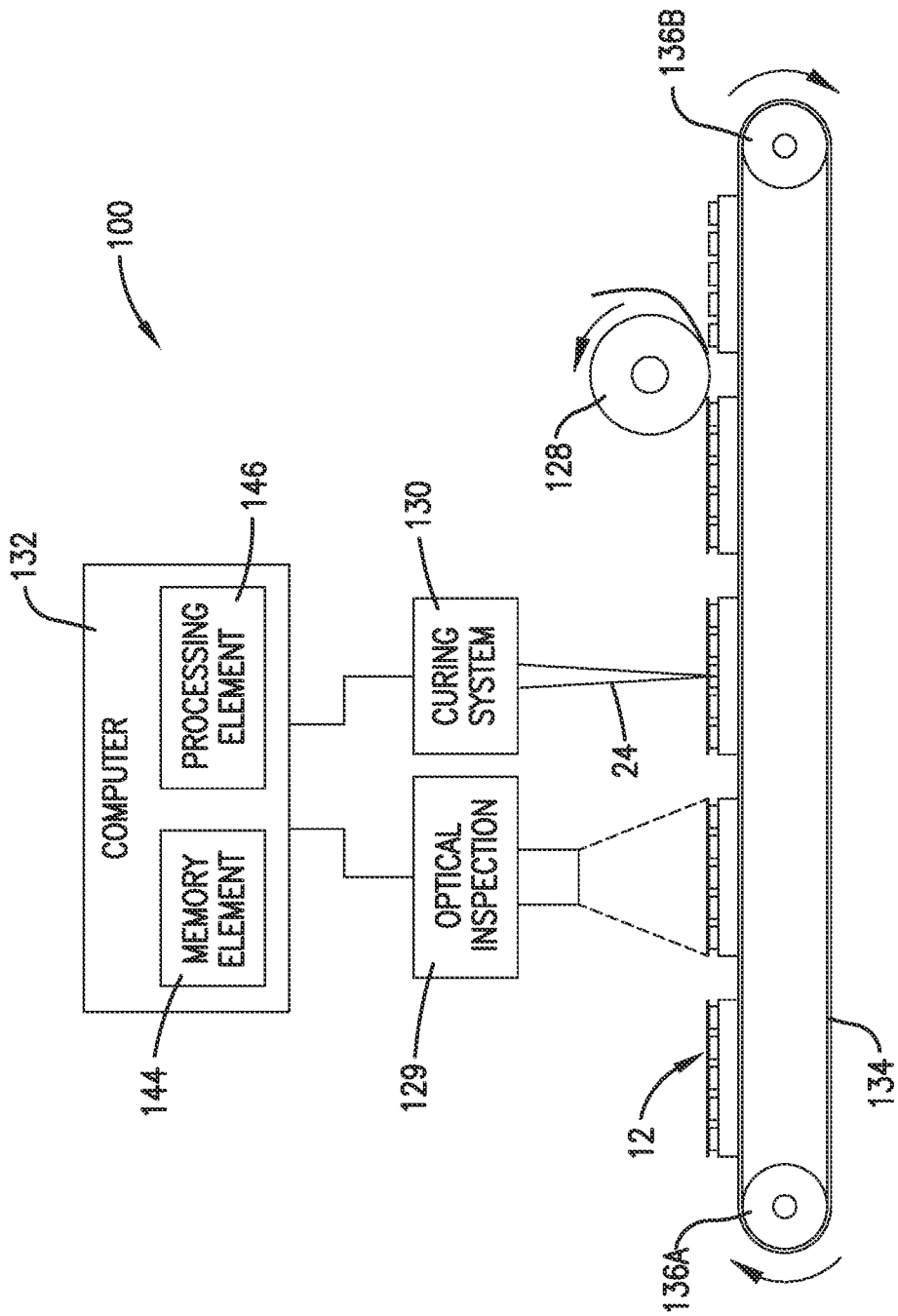
FIG. 6 is a schematic block diagram of a system, constructed in accordance with other embodiments of the current invention, for providing dynamic feedback for selective adhesion printed circuit board (PCB) production.

Referring to FIG. 6, a system 100 according to another embodiment of the current invention for providing dynamic feedback for selective adhesion printed circuit board (PCB) production is shown. The system 100 includes a conveyor mechanism 126 with a belt 134 and first and second rollers 136A, 136B, a peel roller 128, an optical inspection unit 129, a curing system 130 with a laser source 138, a placement mechanism 140, or a printing mechanism 142, and a computer 132 with a memory element 144 and a processing element 146. The conveyor mechanism 126, the peel roller 128, the curing system 130, the computer 132, the memory element 144, and the processing element 146 each are substantially similar in structure and function to the like-named components described above for the system 10.

The optical inspection unit 129 generally provides visual inspection of selective adhesion blanks 12 that have been prepopulated with parts or components. The optical inspection unit 129 may include a camera or a lens-based optical structure configured to provide a moving video image and/or a sequence of periodically-captured still images. In various embodiments, the optical inspection unit 129 may further include a memory element and a processing element, substantially similar in structure to the memory element 44 and the processing element 46, respectively, described above for the system 10.

Figure 7:
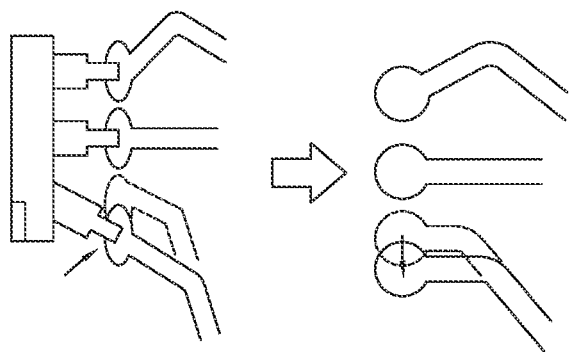
FIG. 7 is a perspective view of a first set of examples of various modifications to a PCB design performed by the system of FIG. 6.
Figure 7:
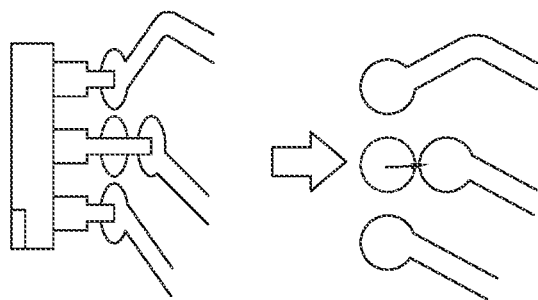
Figure 7:
Figure 7:
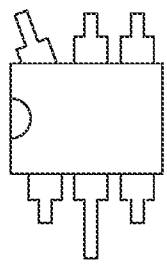
Figure 8:
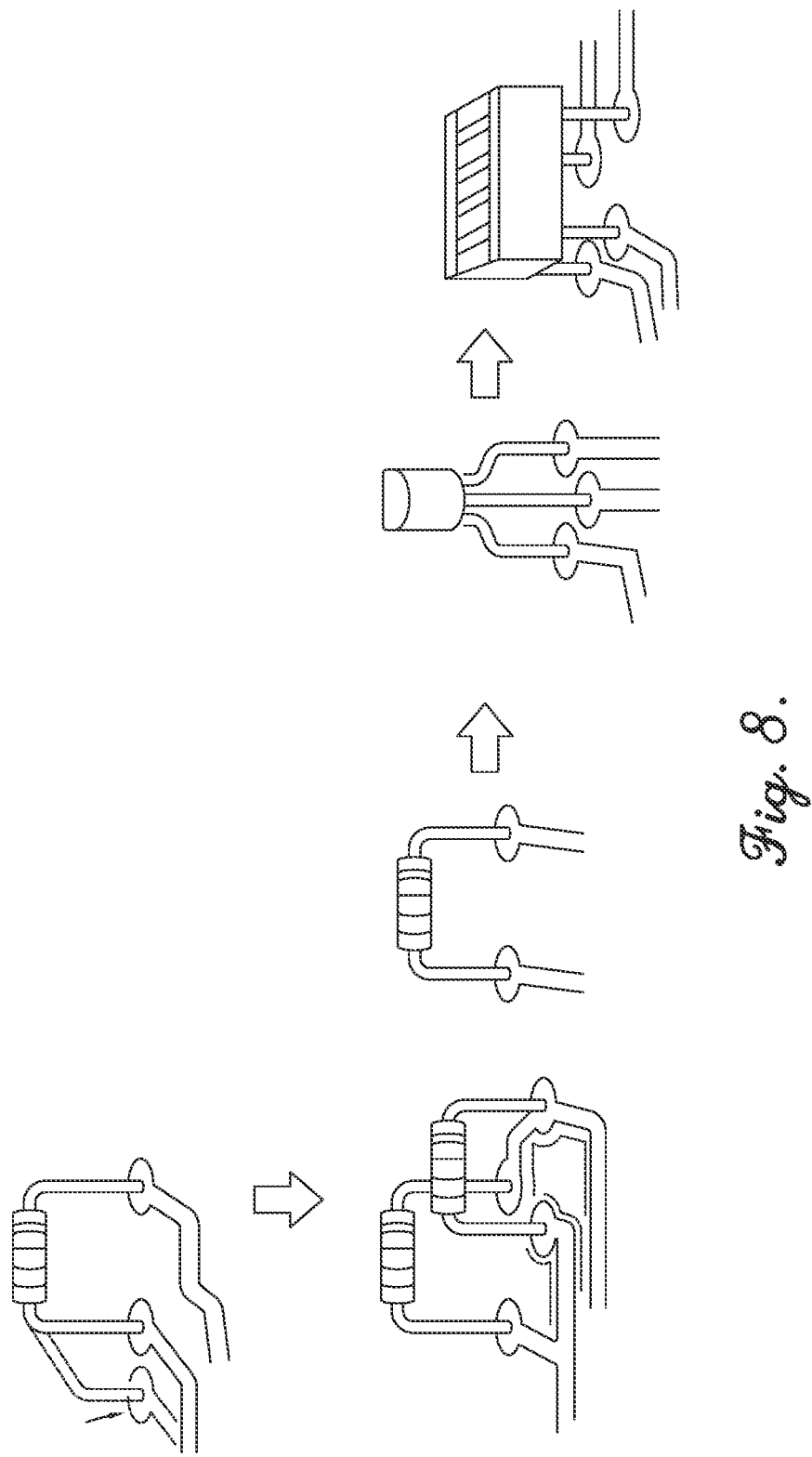
FIG. 8 is a perspective view of a second set of examples of various modifications to a PCB design performed by the system of FIG. 6.

The optical inspection unit 129 either captures moving video and/or periodically-taken still images of the selective adhesion blanks 12 as they are aligned with the camera of the optical inspection unit 129. In some embodiments, the processing element of the optical inspection unit 129 receives current image data from the video or still images and analyzes the current image data of the upper surface of the flexible film 16 with the preplaced parts. The optical inspection unit 129 has standard image data, stored in memory, of what the upper surface of the flexible film 16 including preplaced parts should look like. The optical inspection unit 129 compares the current image data with the standard image data. If no abnormalities are detected, then the system 100 operates as normal. If the optical inspection unit 129 detects an abnormality, such as a pin on an integrated circuit (IC) through-hole or surface mount package or a lead of a discrete component that is positioned or oriented in a manner that is not present in the standard image data, and is not a defect in the part, then the optical inspection unit 129 may determine a modification to the design of the traces and pads for the PCB 14. Referring to FIG. 7, for example, the optical inspection unit 129 may modify the design by moving one or more pads and/or traces to allow the newly-positioned pin to be aligned with the pads to which it should connect. Referring to FIG. 8, in addition, or instead, the optical inspection unit 129 may modify the design by adding one or more parts, along with the appropriate pads and traces, to accompany the changed part or to replace the changed part. The modified design of the PCB 14 is transmitted to the computer 132. Alternatively, the modified design of the PCB 14 may be transmitted directly to the curing system 130.

In other embodiments, the optical inspection unit 129 may transmit or communicate the current image data to the computer 132, and the computer 132 may perform the analysis of the current image data of the selective adhesion blank 12. The processing element 146 may compare the current image data with standard image data retrieved from the memory element 144. The processing element 146 may modify the design of the PCB 14, if necessary The system 100 may operate as follows. Before operation begins, the optical inspection unit 129 and/or the computer 132 are in possession of standard image data of what the upper surface of the flexible film 16 including preplaced parts should look like for a particular design of the PCB 14. And, the curing system 130 is configured to cure the curable adhesive 18 of each selective adhesion blank 12 to implement the particular design for the PCB 14.

A series of selective adhesion blanks 12 are fed or supplied to the conveyor mechanism 126. The selective adhesion blanks 12 move forward on the conveyor mechanism 126 to the optical inspection unit 129. The computer 132 may direct or control the operation of the conveyor mechanism 126, such as setting the speed, and starting and stopping the belt 134. The optical inspection unit 129 captures moving video or still images of each selective adhesion blank 12 as it comes into view. The optical inspection unit 129 generates current image data of the upper surface of the flexible film 16 including the preplaced parts. The optical inspection unit 129 may include a memory element and a processing element which analyze the current image data, and/or the optical inspection unit 129 may transmit the current image data to the computer 132. The processing element of either the optical inspection unit 129 or the computer 132 compares the current image data with standard image data of what the upper surface of the flexible film 16 including preplaced parts should look like. If no abnormalities are detected, then there is no change to the design for the PCB 14. If the processing element detects an abnormality or a difference between the current image data and the standard image data, such as a pin on an integrated circuit (IC) through-hole or surface mount package or a lead of a discrete component that is positioned or oriented in a manner that is not present in the standard image data, and is not a defect in the part, then the processing element may determine a modification to the design of the traces and pads for the PCB 14. Referring to FIG. 7, for example, the processing element may modify the design by moving one or more pads and/or traces to allow the newly-positioned pin to be aligned with the pads to which it should connect. Referring to FIG. 8, in addition, or instead, the processing element may modify the design by adding one or more parts, along with the appropriate pads and traces, to accompany the changed part or to replace the changed part.

If there are no modifications to the design of the PCB 14, then the curing system 130 cures the curable adhesive 18 on each selective adhesion blank 12, as described above for the system 10.

If there are modifications to the design of the PCB 14, then the computer 132 may transmit the modified design of the PCB 14 to the curing system 130 and then direct the curing system 130 to cure the curable adhesive 18 to form the pattern of traces and pads for the modified design of the PCB 14. In some embodiments, the curing system 130 utilizes the laser source 138 and directs the laser beam to follow a new path to implement the modified design of the PCB 14. In other embodiments, the curing system 130 generates one or more new masks to implement the modified design of the PCB 14 and the placement mechanism 140 places the new masks or the printing mechanism 142 prints the new masks. The computer 132 may continue to direct the curing system 130 to utilize the modified design of the PCB 14 for each selective adhesion blank 12 which was detected to have the same difference in design.

Alternatively, the optical inspection unit 129 transmits the modified design of the PCB 14 to the computer 132 which transmits it to the curing system 130, or the optical inspection unit 129 transmits the modified design of the PCB 14 to the curing system 130 directly.

After being cured, the selective adhesion blanks 12 move forward on the conveyor mechanism 126 to the peel roller 128. The side wall of the peel roller 128 contacts the upper surface of the flexible film 16 and attaches to the flexible film 16. As the conveyor mechanism 126 moves the selective adhesion blank 12 forward, the rotation of the peel roller 128 pulls the flexible film 16 upward, removing the flexible film 16, the curable adhesive 18, and the bonded conductive layer 20. After the selective adhesion blank 12 moves past the peel roller 128, the flexible film 16, the curable adhesive 18, and the bonded conductive layer 20 are completely removed, and the PCB 14 is ready to be further processed.

Additional Considerations

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. A system for providing dynamic feedback for selective adhesion printed circuit board (PCB) production, the system comprising:
 a conveyor mechanism configured to convey a series of selective adhesion blanks, each selective adhesion blank being prepopulated with parts and utilized to produce a PCB, each selective adhesion blank including:
  a flexible film forming a top layer of the selective adhesion blank,
  a substrate forming a bottom layer of the selective adhesion blank,
  a conductive layer formed from electrically conductive material and adhered to the substrate, and
  a curable adhesive positioned between the flexible film and the conductive layer, the curable adhesive configured to selectively bond with the conductive layer when the curable adhesive is cured;
 an optical inspection unit configured to generate current image data of each selective adhesion blank;
 a curing system configured to cure the curable adhesive for each selective adhesion blank; and
 a computer including a processing element in electronic communication with a memory element, the processing element configured or programmed to:
  receive a PCB design including placement of the parts and a pattern of traces and pads,
  receive the current image data,
  compare the current image data with standard image data corresponding to the PCB design,
  determine a modification to the PCB design if a difference between the current image data and the standard image data is detected, and
  direct the curing system to cure the curable adhesive of each selective adhesion blank for which the difference is detected according to the modification of the PCB design.

2. The system of claim 1, wherein the processing element is further configured or programmed to direct the curing system to cure the curable adhesive of each selective adhesion blank according to the PCB design if a difference between the current image data and the standard image data is not detected.

3. The system of claim 1, wherein the modification to the PCB design includes a relocation of one or more traces.

4. The system of claim 1, wherein the modification to the PCB design includes a relocation of one or more pads.

5. The system of claim 1, further comprising a peel roller configured to remove the flexible film, the curable adhesive, and the bonded conductive layer.

6. The system of claim 1, wherein the curing system includes a laser source configured to generate a laser beam to strike the curable adhesive in areas that create a negative of each PCB design.

7. The system of claim 1, wherein the curing system includes a printing mechanism configured to print a mask onto an upper surface of the flexible film.

8. The system of claim 1, wherein the curing system includes a placement mechanism configured to place a mask onto an upper surface of the flexible film.

\* \* \* \* \*